United States Patent [19]

Moonen

[11] Patent Number: 5,459,400
[45] Date of Patent: Oct. 17, 1995

[54] METHOD TO ENHANCE THE SENSITIVITY OF MRI FOR MAGNETIC SUSCEPTIBILITY EFFECTS

[75] Inventor: Chrit T. W. Moonen, Silver spring, Md.

[73] Assignee: The United States of America as represented by the Department of Health & Human Services, Washington, D.C.

[21] Appl. No.: 106,372

[22] Filed: Aug. 13, 1993

Related U.S. Application Data

[63] Continuation-in-part of Ser. No. 841,994, Feb. 28, 1992, Pat. No. 5,300,886.

[51] Int. Cl.$^6$ ........................................................ G01V 3/00
[52] U.S. Cl. ............................................ 324/309; 324/307
[58] Field of Search ..................................... 324/300, 307, 324/308, 309, 310, 311, 313, 314

[56] References Cited

U.S. PATENT DOCUMENTS

5,270,654  12/1993  Feinberg et al. ..................... 324/309
5,300,886   4/1994  Moonen ............................... 324/309

*Primary Examiner*—Louis Arana
*Attorney, Agent, or Firm*—Morgan & Finnegan

[57] ABSTRACT

A method for enhancing the sensitivity of gradient-recalled echo imaging for T2* effects in dynamic magnetic resonance imaging which involves the step of delaying gradient-recalled echoes so that the gradient-recalled echoes are subjected to magnetic susceptibility effects for an extended period of time. The gradient-recalled echoes are delayed beyond a subsequent radio frequency pulse by applying an additional gradient which dephases any gradient-recalled echo of spins that are excited in the radio frequency repetition time period in which said gradient-recalled echoes are produced.

23 Claims, 12 Drawing Sheets

METHOD TO ENHANCE THE SENSITIVITY OF MRI FOR MAGNETIC SUSCEPTIBILITY EFFECTS

This application is a continuation-in-part of U.S. application Ser. No. 07/841,994, filed Feb. 28, 1992, now Pat. No. 5,300,886.

TECHNICAL FIELD

The present invention relates to magnetic resonance imaging (MRI). More particularly, the present invention relates to methods of enhancing the sensitivity of magnetic resonance imaging for susceptibility effects.

BACKGROUND ART

Several known functional MR imaging studies based on detection of temporary changes in T2* which result from local changes in magnetic susceptibility have been conducted. Among these are measurements of regional cerebral blood volume (rCBV) using a bolus injection of contrast agent (A. Villringer et al, *Magn. Reson. Med.*, Vol. 6 (1988), page 164; B. R. Rosen et al, *Magn. Reson. Q.*, Vol. 5 (1989), page 26; C. T. W. Moonen et al, *Science*, Vol. 250 (1990), page 53; J. W. Belliveau et al, *Science*, Vol. 254 (1990), page 716) and of local changes in brain oxygenation state (S. Ogawa et al, *Magn. Reson. Med.*, Vol. 14 (1990), page 68; R. Turner et al, *Magn. Reson. Med.*, Vol. 22 (1991), page 159). Most of these studies are carried out with echo-planar MRI methods because of their high intrinsic sensitive for T2*. In principle, conventional methods based on gradient-recalled echoes (A. Haase et al, *Magn. Reson.*, Vol. 67 (1986), page 258; D. Matthaei et al, *Lancet*, Vol. 2 (1985), page 893; F. W. Wehrli, *Magn. Reson. Q.*, Vol. 6 (1990), page 165) are also T2* sensitive, but the T2* sensitivity generally has to be compromised in order to reach the desired time-resolution. For example, blood volume measurements in the brain based on tracking the passage of a bolus of contrast agent require a time-resolution of the order of 1 s per image due to the short transit time of blood. For 128 phase encode steps, this limits the TR (repetition time) to about 8 ms and TE (echo time) to about 5 ms.

The present invention, hereafter referred to as an "echo-shifted" gradient-recalled echo method, involves methods of magnetic resonance imaging which have enhanced sensitivity to T2* changes, as compared to methods known heretofore.

DISCLOSURE OF THE INVENTION

It is one object of the present invention to provide a method of magnetic resonance imaging.

Another object of the present invention is to provide a method of enhancing the sensitivity of magnetic resonance imaging for magnetic susceptibility effects.

It is a further object of the present invention to provide a method of increasing the sensitivity of fast gradient-recalled echo imaging for T2* effects in dynamic in vivo magnetic resonance imaging.

A still further object of the present invention is to provide for a method of measuring blood flow and blood volume by magnetic resonance imaging.

According to these and further objects of the present invention which will become apparent as the description thereof is present below, there is provided by the present invention a method for performing MRI imaging of an object which involves:

subjecting an object to a first radio frequency pulse to produce a gradient-recalled echo having an echo time period, the radio frequency having a repetition time period; and shifting the produced gradient-recalled echo so that the echo time of the gradient-recalled echo is greater than the repetition time of the radio frequency.

The present invention also provides for a method for enhancing the sensitivity of gradient-recalled echo imaging for T2* effects in dynamic in vivo magnetic resonance imaging which involves the step of delaying a gradient-recalled echo so that the gradient-recalled echo is subjected to magnetic susceptibility effects for an extended period of time.

The present invention further provides for an improvement in known methods for producing MRI images in which gradient-recalled echoes are produced in a series of repetition time periods, the improvement involving shifting the gradient-recalled echoes beyond the repetition time periods in which they are produced.

BRIEF DESCRIPTION OF DRAWINGS

The present invention will be described with reference to the attached drawings which are given for non-limiting illustrative purposes only, in which:

FIG. 2b is a contrast agent concentration-time curve (corrected for the duration of the TE-weighting) for a conventional gradient-recalled echo sequence (symbol x) compared to a shifted-echo sequence (solid triangles) obtained utilizing equation 1 (below) applied to the data of FIG. 2a.

FIGS. 3a–3d are images (field-of-view 100×100 mm) obtained from the same axial slice through a cat brain.

BEST MODE FOR CARRYING OUT THE INVENTION

The present invention is directed to a new concept of fast gradient-recalled echo imaging which allows the excellent time-resolution of fast gradient-recalled echo imaging but drastically enhances the sensitivity to T2* effects, and to a lesser degree, T2 effects.

The method of the present invention is based on a gradient-recalled echo technique, where the desired gradient-recalled echo is shifted so that the magnetic susceptibility effects on the resulting echo are more pronounced. This shifting of the gradient-recalled echo has been found to increase the echo-time TE to values larger than TR while maintaining full T2* sensitivity during the entire TE period because no RF (radio frequency) refocussing occurs.

The present invention is based on a pulse sequence that shifts the gradient-recalled echo preferably beyond the subsequent RF pulse without refocusing the chemical shift. According to one preferred embodiment of the present invention the gradient-recalled echo is shifted one complete TR period. In further embodiments of the present invention the gradient-recalled echo may be shifted less or more that one complete TR period utilizing the principles of the invention as discussed below.

The method of the present invention has been found to enhance the sensitivity of rapid magnetic resonance imaging for magnetic susceptibility effects. One particular advantage of the present invention is that the method allows for the measurement of blood flow and blood volume by magnetic resonance imaging using one or more boli of magnetic resonance imaging contrast agent(s) and for changes in intrinsic susceptibility effects without injection of magnetic resonance imaging contrast agents.

Figure 1A:
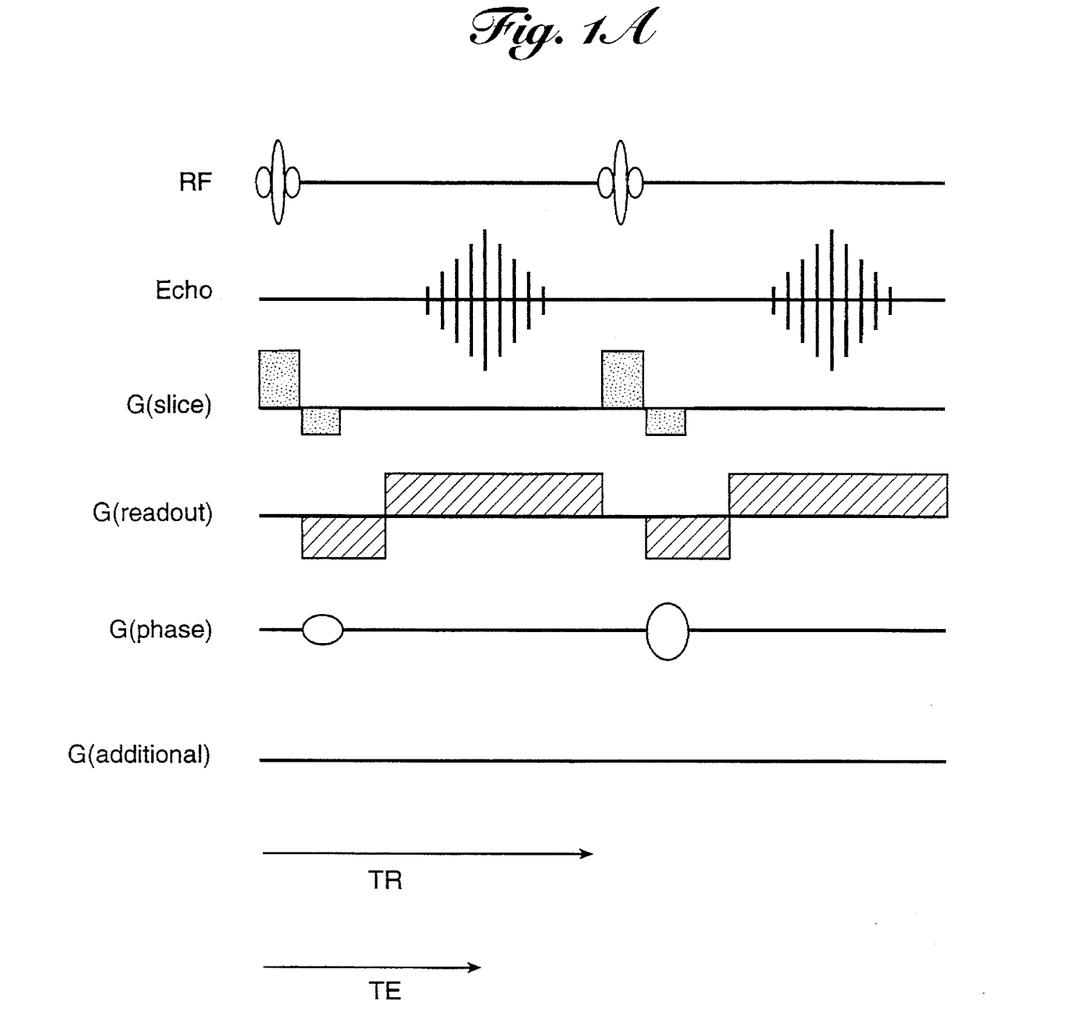
FIG. 1a is a pulse sequence for gradient-recalled echo imaging according to a conventional method.
Figure 1B:
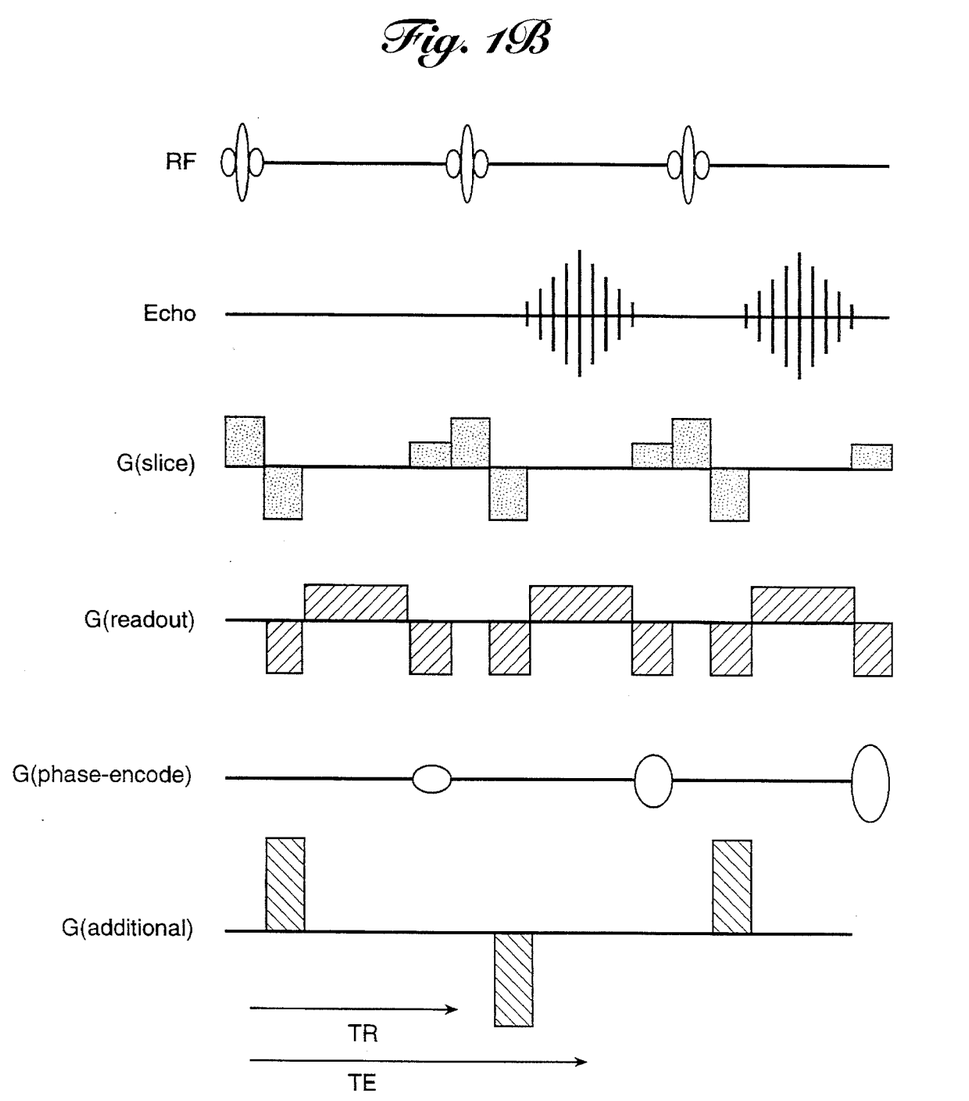
FIG. 1b is a pulse sequence for echo-shifted gradient-recalled echo imaging according to the present invention.

FIG. 1b is illustrative of the method of the present invention. This figure shows a convenient way to achieve the goal of the present invention. Some specifics illustrated, like the exact position of the phase-encoding gradient, is unimportant as would be realized by one skilled in the art.

As compared to conventional gradient-recalled echo imaging pulse sequences (FIG. 1a), the echo-shifted gradient-recalled echo imaging pulse sequence of the present invention (FIG. 1b) involves a first TR period in which no acquisition of data is performed. Phase encoding at the end of the first TR period is used to form an echo in the next TR period. In the first TR period an additional gradient pulse (crusher gradient) in any direction is applied to dephase the gradient-recalled echo in the first TR period. In subsequent TR periods, as shown, the polarity of the additional gradient pulse is switched in order that spins excited by the RF pulse in the n-th TR period are rephased in the (n+1)th period with respect to the additional gradient pulse.

A slice selective gradient applied in the first TR period is reversed in its entirely before the echo (and not approximately with half the integrated intensity as in conventional gradient-recalled echo sequences).

At the end of the first TR period approximately half of the slice selective gradient is added to arrive at the end of the TR period n with rephased magnetization of spins excited in the same n-th TR period.

In all following TR periods the additional gradient pulse is changed in sign in each subsequent TR period as noted above. Phase encoding is incremented in a conventional way k times. With the number of phase-encodings k, there are k+m TR periods, where m is the number of TR-period shifts (m is 1 in FIG. 1b).

Also in the following TR periods the slice selective gradient is reversed in its entirety before the echo (and not approximately with half the integrated intensity as in conventional gradient-recalled echo sequences).

At the end of the n following TR periods approximately half of the slice selective gradient is added to arrive at the end of the TR period n with rephased magnetization of spins excite in the same n-th TR period.

The principles and theory of magnetic resonance utilized in the method of the present invention will be described with reference to FIG. 1b hereafter. A general discussion of the basic principles and theory of magnetic resonance imaging can be found in F. Wehrli, "Principles of Magnetic Resonance", *Magnetic Resonance Imaging*, 2nd Edition (1992), Mosby-Year Book, St. Louis, Mo., the disclosure of which is expressly incorporated herein by reference.

FIG. 1b shows a modified pulse sequence where TE is larger than TR. According to the present invention, the gradient-recalled echo of spins excited by the first RF pulse is refocussed in the second TR-period as discussed below. Likewise, the gradient-recalled echo of spins excited by the second RF pulse are refocussed in the third TR-period. In general, spins excited in the n-th period are refocussed in the (n+1)-th TR period. Thus, the echo produced by the RF pulse in one TR period is shifted to the next TR period. The shifted echo is realized by bringing the gradient-recalled echo spins in phase at a desired delayed echo-time (TE) with respect to each principal gradient and by dephasing other possible gradient- and spin-echoes. This is achieved by the use of an additional (crusher) gradient, a read-out gradient, a slice-select gradient, and a phase encode gradient as shown in FIG. 1b.

In the beginning of each TR period an additional (crusher) gradient is used to dephase any gradient-recalled echo of spins that are excited and would otherwise remain in the same TR-period. The polarity of the additional gradient is alternated for each Tr period as shown in order to rephase spins excited by the RF pulse applied during the n-th TR period in the (n+1)-th period with respect to the additional gradient. Any direction can be used for the additional gradient.

As shown, an applied slice-select gradient is reversed completely in the beginning of each TR period in order to maintain equal phase for all spins that were excited by the RF pulse in the previous TR-period. Following the acquisition period in the n-th TR period (of signal of spins excited in (n−1)th TR period), a gradient in the slice direction is used to bring spins in phase that were excited in n-th TR period.

Phase encoding is achieved at the end of each TR period by application of a phase-encode gradient in a known manner.

RF pulses in the subsequent sequences do not serve as refocussing pulses for rephased echoes. They serve as excitation pulses in the n-th TR-period leading to the desired echo in the (n+1)-th TR-period. Thus, transverse magnetization created in the n-th period leading to the echo in the (n+1)-th period remains unchanged by the RF pulse of the (n+1)-th TR-period.

Defining a coherence order for each TR-period following coherence pathway formalism as discussed by G. Bodenhausen et al, *J. Magn. Reson.*, Vol. 58 (1984), page 370; R. R. Ernst et al, *Principles of Nuclear Magnetic Resonance in One and Two Dimensions*, Clarendon Press, Oxford (1987), pages 118–119; C. T. W. Moonen et al, *J. Magn. Reson.*, Vol. 88 (1990), page 28, the disclosures of which are each expressly incorporated by reference, the coherence order −1 of the n-th TR-period remains −1 in the (n+1)-th TR-period until the echo is collected (desired coherence pathway p is p(−1,−1)). However, not all transverse magnetization created in the n-th TR-period will remain unchanged and lead to the desired echo, because a RF pulse is used between the two periods. This RF pulse of the (n+1)-th TR-period may convert some transverse magnetization. Following conventional coherence pathway formalism, the unchanged transverse magnetization (pathway p(−1,−1)) created in the n-th TR-period as a function of the RF pulse of the (n+1)-th TR-period with flip angle $\theta$ equals $\cos 2(\theta/2)$ times the originally created transverse magnetization.

For example, a flip angle of 30 degrees will leave more than 93% of the transverse magnetization unchanged and leads thus to a loss of less than 7%. Thus, the gradient scheme of the present invention leads to rephasing of only coherence path p(−1,−1), whereas all other pathways, leading to observable magnetization, are dephased.

It is also within the purview of this invention to further increase the time resolution of known methods for producing MRI images in which gradient-recalled echoes are produced in a series of repetition time periods. As discussed hereinabove, applications of conventional GRE techniques are limited by the trade-off between T2* weighting and acquisition speed. The present invention provides a method for acquiring NMR information which has both high temporal resolution and high T2* sensitivity by shifting echoes to subsequent TR periods. In accordance with the present invention, the time resolution of T2* sensitive fast gradient-recalled echo techniques is further increased by employing a pulse sequence which generates multiple echoes per TR period (referred to as an echo train), and shifts each echo train to control T2* sensitivity.

Figure 4A:
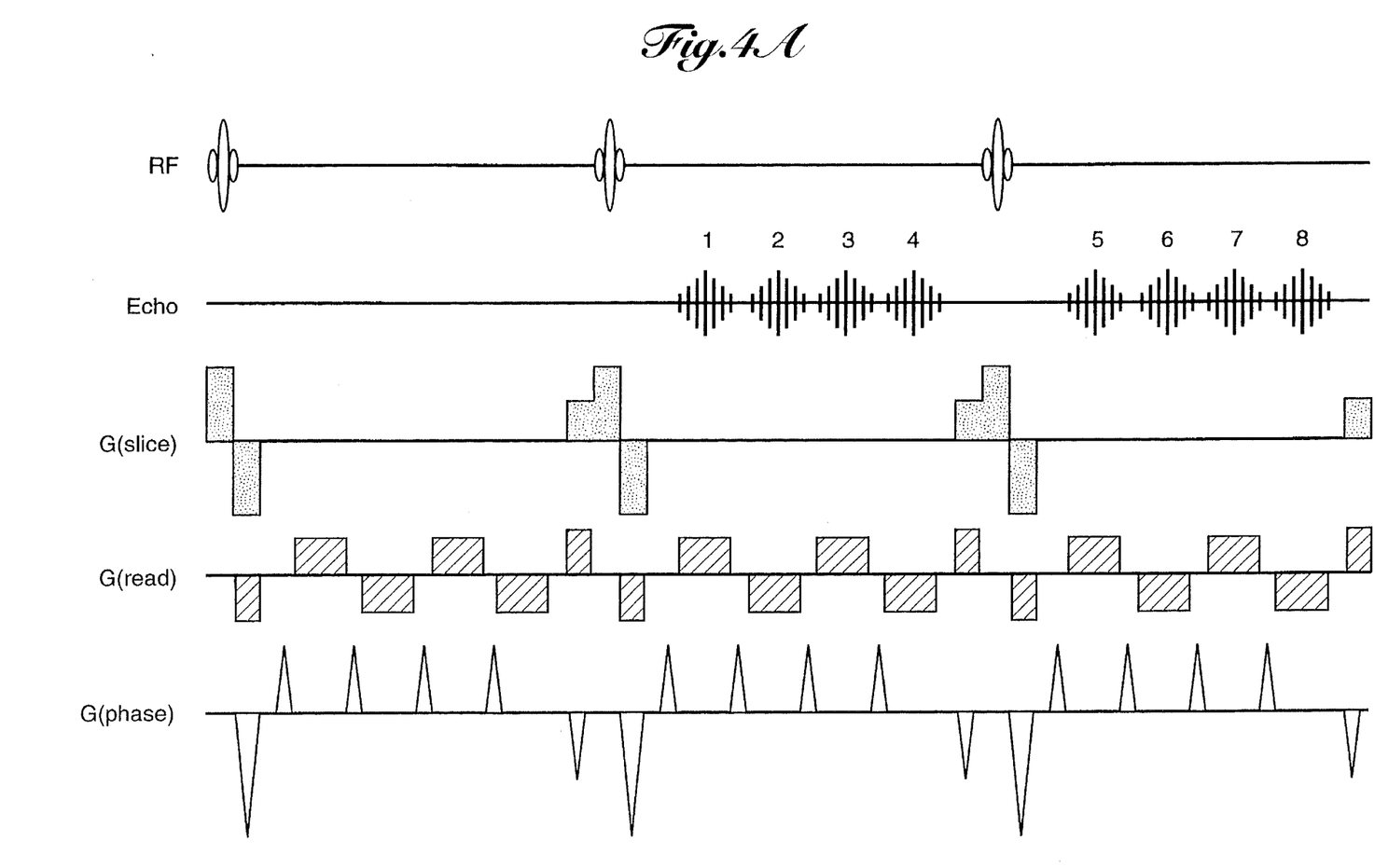
FIG. 4A is another pulse sequence for echo-shifted gradient-recalled echo imaging according to the present invention.

FIG. 4A shows an illustrative pulse sequence for shifting multiple echoes per TR period. Four gradient-recalled echoes are acquired per TR-period by the particular slice-selection gradient scheme. Spins excited by the first RF pulse lead to the four gradient echoes during the second TR-period. Spins excited by the second RF pulse lead to the four gradient echoes in the third TR-period. In general, for this illustrative pulse sequence, spins excited in the n-th period are refocussed four times in the (n+1)-th TR-period.

Figure 4B:
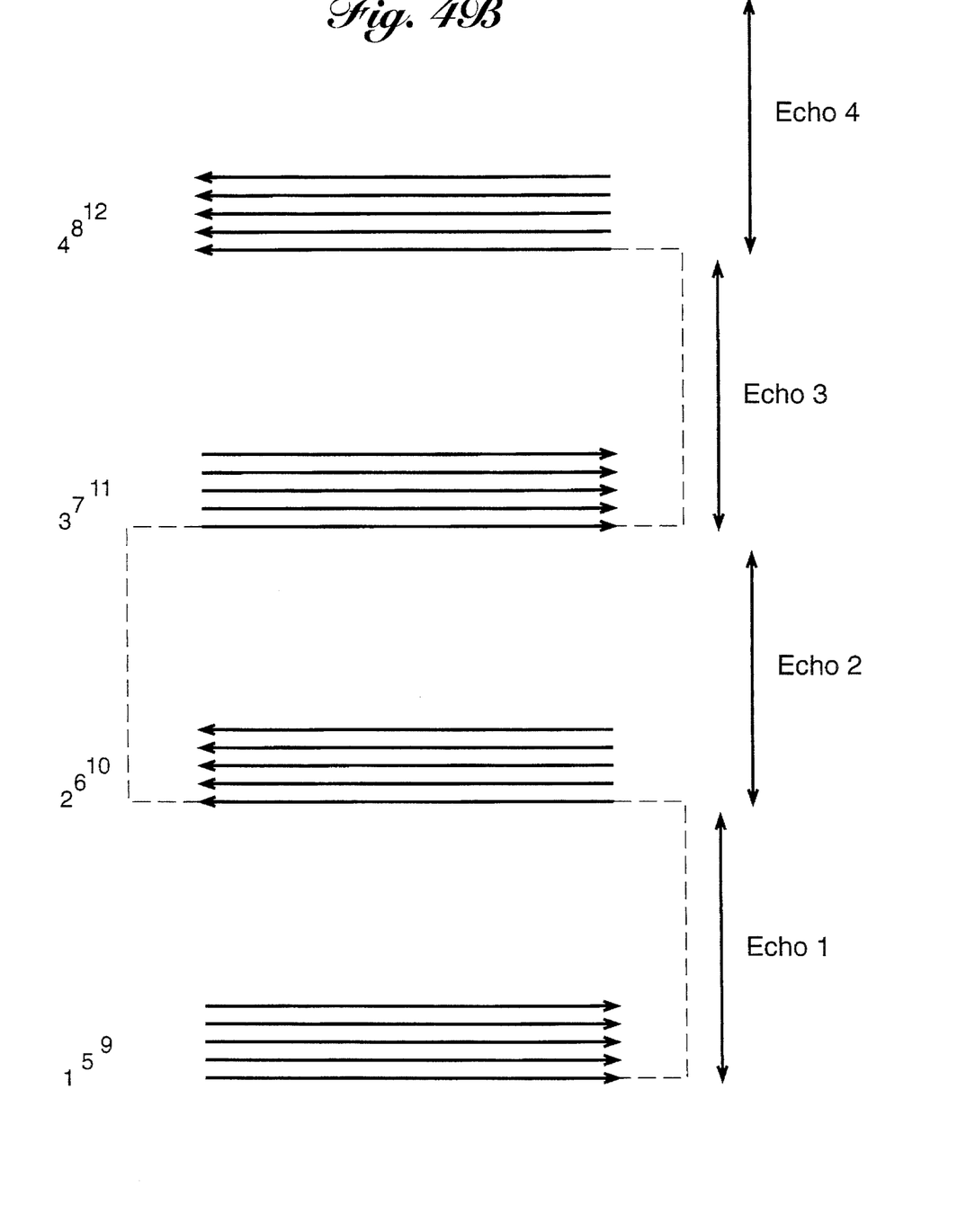
FIG. 4B is a schematic illustration of the k-space sampling trajectory the pulse sequence of FIG. 4A.

As shown in FIG. 4B, the slice-selection gradient during the RF pulse is followed by an inverted lobe of equal duration to maintain zero net dephasing for all spins that were excited in the previous TR period. Following the acquisition period, a rephasing gradient pulse is used to rephase spins excited in the current TR period. In order to shift the echo train n TR periods, the amplitude of the rephasing gradient pulse should be divided by n, which has been described by G. Liu et al., Magn. Reson. Med., vol. 30, 68–75, (1993), which is expressly incorporated by reference.

In the read-out gradient sequence, a dephasing gradient is followed by a gradient switch scheme such that spins are refocussed at the middle of each of the four read-out periods. Furthermore, a rephasing lobe is placed following the echo-train resulting in zero net dephasing within each TR-period.

Figure 5:
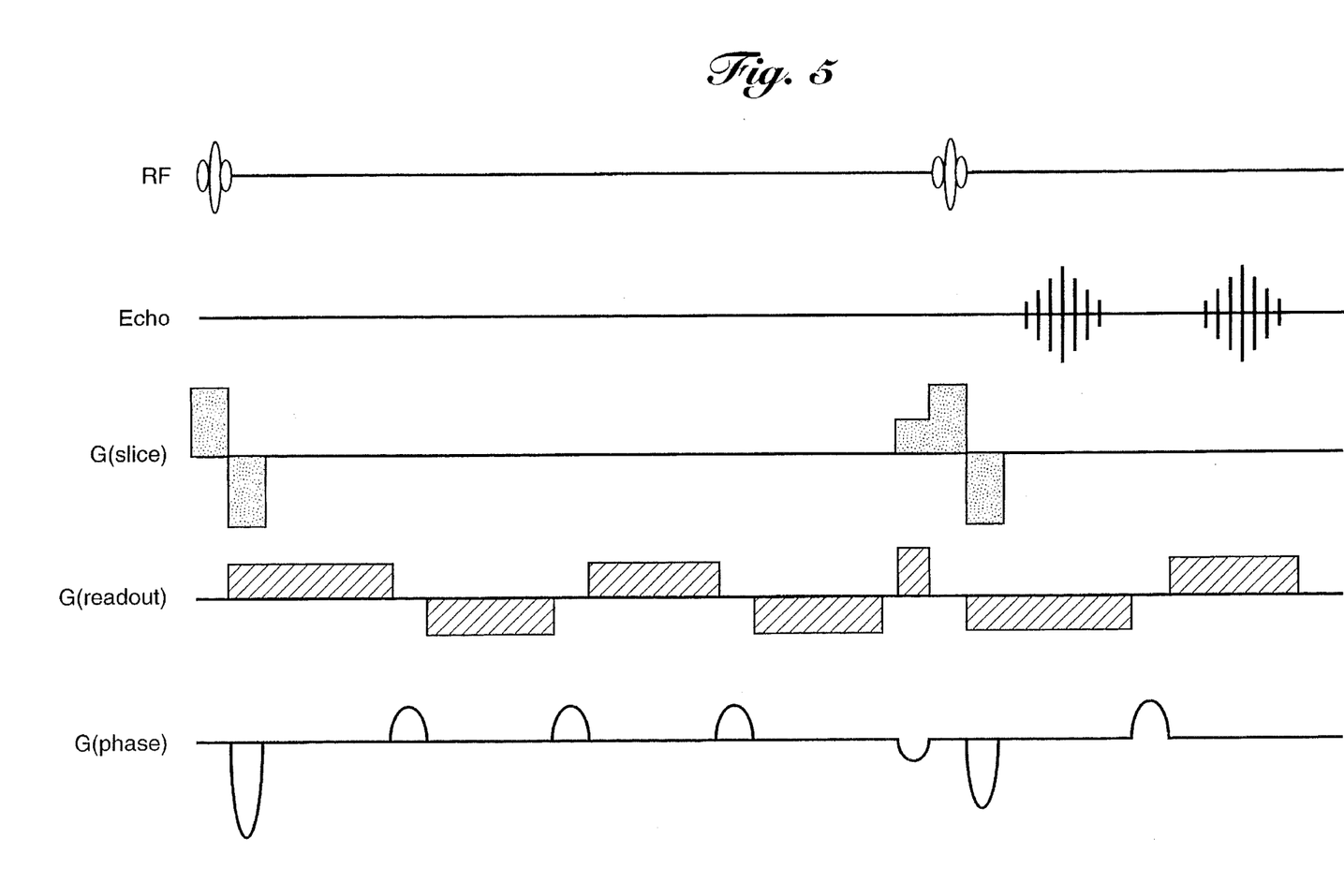
FIG. 5 is yet another pulse sequence for echo-shifted gradient-recalled echo imaging according to the present invention.

Each gradient echo is phase encoded according to the k-space trajectory shown in FIG. 5B, which is similar to that of the GRASE technique, (K. Oshio and D. A. Feinberg, Magn. Reson. Med., 20, 344 (1991)). The first acquired echo is encoded with the maximum negative phase encoding. The "blip" between subsequent echoes increases the phase corresponding to one quarter of the full $k_y$-space. Although a phase encoding sequence with three "blips" could be employed, four "blips" are preferably used to maintain better symmetry in the pulse sequence and thus, to minimize the effects of residual gradients. Preferably, phase-encoding rewinders are used at the end of each TR-period to bring spins back in phase prior to the next RF excitation. In the next TR-period, the initial dephasing lobe and the rewinder lobe are incremented, whereas the "blips" remain identical.

After acquisition the gradients collected with negative read-out gradients are reversed, and all the echoes are reshuffled into their proper positions in k-space. A standard 2D-FT reconstruction is then used to generate an image.

FIG. 5 shows another pulse sequence for shifting multiple echoes one complete TR period. Shifting of the echoes is achieved by controlling the spin phase through both the read-out gradient (i.e., G(readout)) and the slice selection gradient (i.e., G(slice)). After slice selection by the combination of an RF pulse and a slice selection gradient, a prolonged readout gradient dephases the gradient-echoes for spins excited within the same TR period, and rephases gradient-echoes induced in the previous TR period (note the alternating polarity of the readout gradient sequence for temporally adjacent TR periods). At the end of the first TR period, a readout gradient is placed with half the intensity of a normal read-out gradient in order to position the echoes correctly in the subsequent TR-period. The application of an equal magnitude, reversed slice selection gradient after slice selection, and a positive slice selection pulse with half the intensity at the end of the TR period also contributes to shifting the echoes by controlling dephasing of spins excited in previous TR periods and rephasing of spins excited in the current TR period, respectively. The phase encoding pulses (i.e., G(phase)) at each readout gradient reversal phase encodes each of the induced echo signals so that each echo signal represents a k-space scan with a different $k_y$ value.

Thus, in accordance with the disclosed method, acquisition speed is increased by acquiring multiple k-space lines for each TR period, and T2* sensitivity is enhanced by shifting gradient-echoes induced in a given TR period to a subsequent TR period (i.e., TE> TR). It is understood that, in accordance with the present method, the echoes may be shifted more than one TR period, thereby permitting variable T2* weighting. Since the TR period is preferably relatively short, the range of T2* weighting for the echoes acquired in a given TR period is relatively small, yet the average T2* weighting may be varied to increase sensitivity to dynamic susceptibility effects by shifting the echo train a variable number of TR-periods.

This embodiment is particularly advantageous for use in functional imaging, such as blood perfusion measurements, where both rapid acquisition and T2* weighting are required. Generally, for a given effective echo time, TE, an echo train having j echoes will result in about a j-fold increase in the acquisition rate compared with the illustrative pulse sequence shown in FIG. 1B. It is understood that, in general, (p/j+ m) TR periods are required for p phase encode steps, j read-out periods per TR cycle (i.e., j echoes per echo train), and where the echoes are shifted m TR periods. For example, for a 64×64 image and a delay of one TR period, 17 TR periods are required when four echo per TR period are acquired. When a dynamic experiment is performed with continuous imaging, p/j TR periods are sufficient for images after the first image since signal excitation for the initial TR periods of the subsequent image can be performed by the final RF pulses of the preceding image.

Although the illustrative pulse sequences of FIG. 4A and FIG. 5 provide many specificities, these enabling details should not be construed as limiting the scope of the invention, and it will be readily understood by those persons skilled in the art that the present invention is susceptible to many modifications, adaptations, and equivalent implementations without departing from this scope. For instance, although these illustrative pulse sequences show pulse sequences without further additional gradient pulses for appropriately dephasing and rephasing the spins while concomitantly suppressing undesired or spurious echoes, such additional gradients may be applied separately in analogous fashion to the embodiment of FIG. 1B. Also, although rephasing gradients are employed at the end of each TR period for rephasing spins excited in the current TR period, rephasing gradients may instead be employed such that they rephase spins excited in prior periods (.e.g., rephasing gradients employed in TR periods between the excitation period and the readout period, inclusively). Such an alternative pulse sequence may be implemented provided that, as in the illustrative embodiments, the effects of all applied gradients on the phase of all excited spins are monitored such that rephasing of desired spins occurs at desired times while undesired and spurious echoes are suppressed.

Many other variations in the timing, magnitude, and directions of the gradient fields may be employed in order to practice the present invention. For instance, the illustrative pulse sequences each induce four echoes per TR period; however, the number of echoes per TR period may be varied. For a given sequence, the number of echoes in different TR periods may vary as well. Each TR period may have a different duration. Also, the average TE may vary for echoes corresponding to different excitation pulses. Further, the echoes may be shifted such that not all of the echoes associated with a given excitation pulse are shifted beyond the subsequent excitation pulse. Such modifications and adaptations may be employed, for example, for reducing artifacts, for enhancing T2* contrast, for simultaneously acquiring images with different T2* weighting, or for increasing the efficiency of the dephasing and rephasing of excited spins.

The following examples are presented to illustrate features and characteristics of the present which is not to be construed as being limited thereto. In the examples, experiments were performed on a 4.7 T Omega CSI instrument (General Electric), equipped with shielded gradients up to 18 G/cm. Animals were ventilated using isoflurane (1%) and a N2O/O2 mixture (7:3): blood pressure, blood gases and heart rate were monitored and kept normal. Succinylcholine (0.8%) was used as a muscle relaxant. For blood-volume measurements, imaging was started at t=0; at t=5 s, 0.1 mmol/kg Gd-DTPA (Magnevist, BERLEX) was manually injected in the femoral vein as a bolus with a duration of approximately 1 s. A 47 mm diameter single-turn surface coil was positioned on the cat head and used for RF transmission and reception. Shimming was performed on the slice of interest resulting in a width of about 25 Hz at half height of the water resonance.

EXAMPLE 1

In this example, the gradient sequence developed during the course of the present invention was applied to the assessment of cerebral blood volume and blood flow in the cat using dynamic contrast-enhanced susceptibility imaging according to principles published recently (A. Villringer et al, *Magn. Reson. Med.*, Vol. 6 (1988), page 164; B. R. Rosen et al, *Magn. Reson. Q.*, Vol. 5 (1989), page 26; J. W. Belliveau et al, *Science*, Vol. 254 (1990), page 716) and compared to a conventional gradient-recalled echo method. Each image was obtained within 600 ms as a 64×64 matrix. TR was 9 ms for both methods. TE was 5 ms for the conventional method. Both sequences were otherwise identical except for the additional sequence of gradients of the present invention which resulted in an echo-time of 14 ms for the new sequence. Due to hardware limitations, a 400 ms delay was inserted between successive images resulting in an actual time-resolution of 1 s for both methods.

Figure 2A:
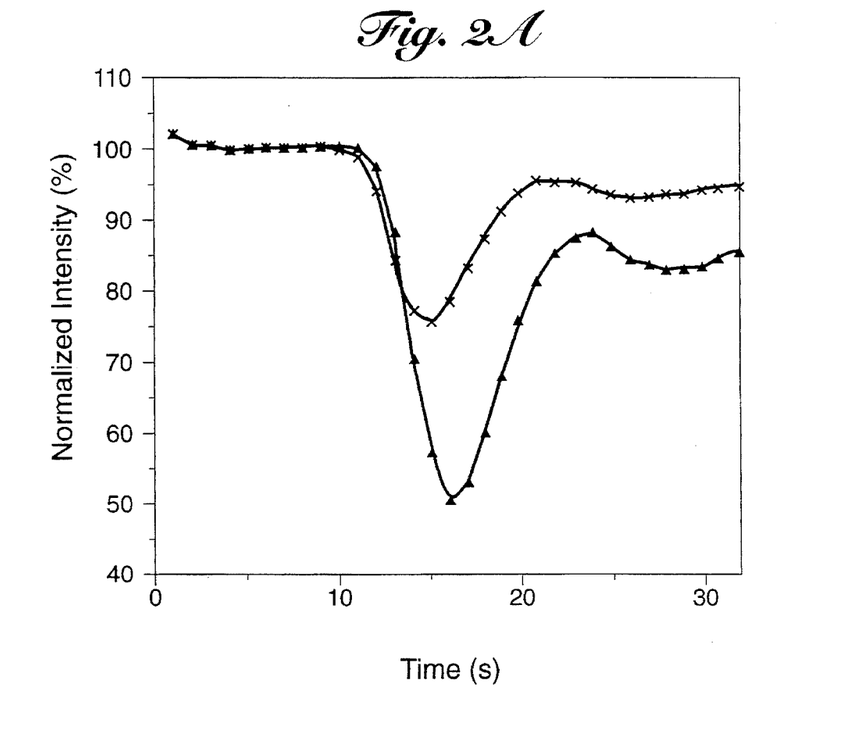
FIG. 2a is a plot of a normalized intensity in percent as a function of time for a conventional gradient-recalled echo sequence (symbol x) which is compared to a shifted-echo sequence (solid triangles) according to the present invention.

FIG. 2a shows the total signal intensity (sum of all voxels with brain tissue) as a function of time using the conventional sequence (symbol x) as compared to the new method of the present invention (solid triangles) and demonstrates the much higher sensitivity of the new sequence to dynamic susceptibility effects.

EXAMPLE 2

Figure 2B:
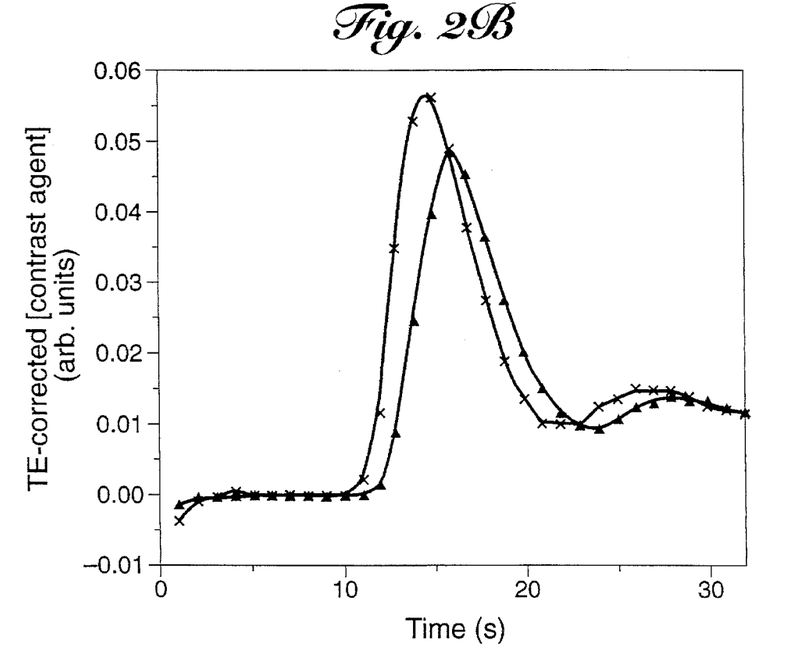

In this example, the data from Example 1 above were processed according to published theory (A. Villringer et al, *Magn. Reson. Med.*, Vol. 6 (1988), page 164; B. R. Rosen et al, *Magn. Reson. Q.*, Vol. 5 (1989), page 26; J. W. Belliveau et al, *Science*, Vol. 254 (1990), page 716). Changes in brain signal intensity due to transit of the bolus were converted to contrast agent concentration-time curve using the following approximate equation:

$$\frac{-\ln \frac{S_c}{S_o}}{TE} = k. \text{[contrast agent]} \quad [1]$$

where SO and Sc refer to the signal intensity without and with contrast agent, respectively, and k is a proportionality constant which is dependent on field strength and the properties of the contrast agent. In order to quantitatively compare the new gradient sequence of the present invention to the conventional sequence the natural logarithm of signal attenuation was corrected for the duration of the TE weighing according to Eq. 1 and plotted versus time. The resulting graphs are shown in FIG. 2b. The similarity of the graphs for both sequences is reasonable given the approximate nature of Eq. 1.

EXAMPLE 3

Figure 3A:
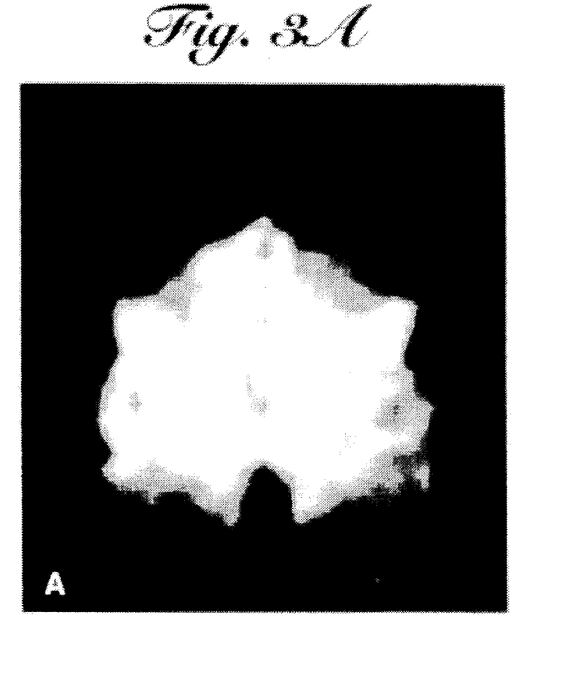
FIG. 3a is an image obtained with the echo-shifted gradient-recalled method of the present invention (TE= 14 ms, TR=9 ms) obtained at t=0, before an injection of bolus.
Figure 3B:
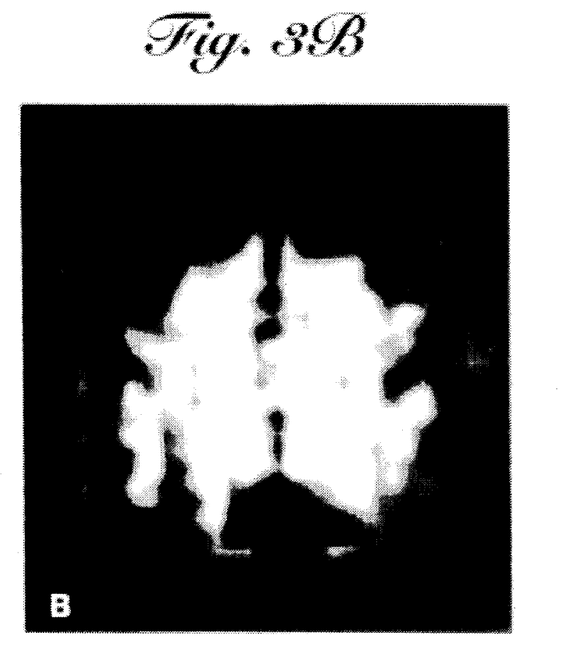
FIG. 3b is an image obtained with an echo-shifted gradient-recalled method according to the present invention (TE= 14 ms, TR=9 ms) obtained at t=8 s, at the maximum contrast agent concentration.
Figure 3C:
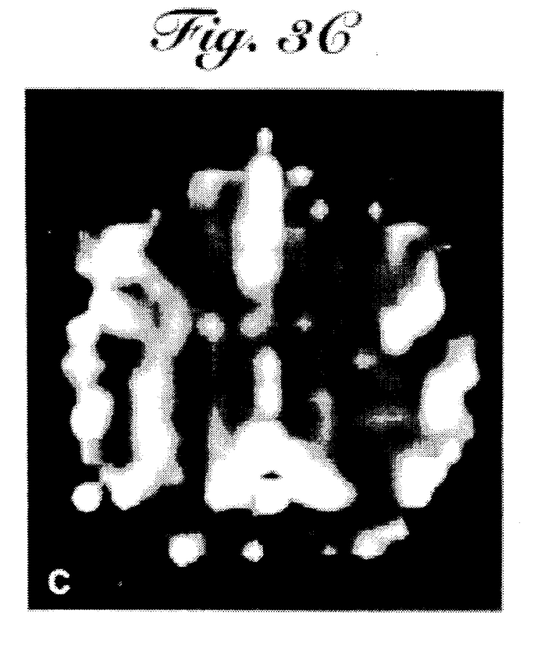
FIG. 3c is a map (64×64) of relative cerebral blood volume as calculated from the complete series of thirty-two consecutive echo-shifted gradient-recalled images.
Figure 3D:
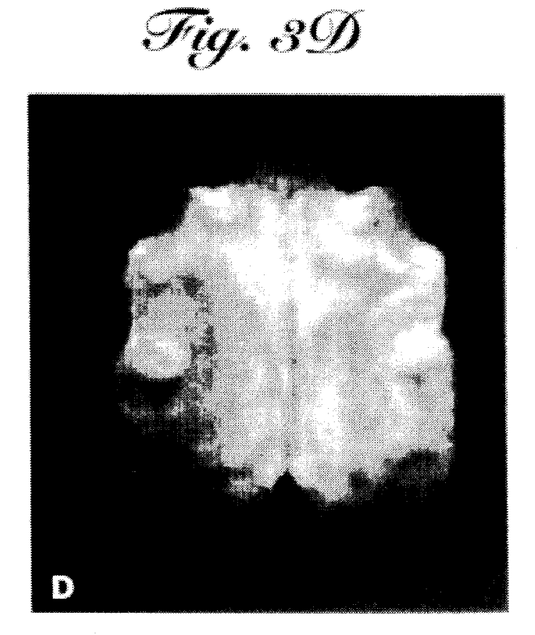
FIG. 3d is a conventional spin-echo image (128× 128) with TE=60 ms, TR= 10–00 ms. Images A and B were obtained using an additional gradient of 0.05 T/m during 1 ms (half-sine wave) in the phase-encoded direction. Acquisition was 4 ms.

In this example images were obtained from the same axial slice of a cat brain and compared. The area under the concentration-time curve, corrected for recirculation, is proportional to blood volume according to conventional tracer kinetics theory (N. A. Lassen et al, *Methods in Medical Physiology*, Raven Press, N.Y. (1979)). Such calculations were performed using a fit according to a gamma-variate function (A. Villringer et al, *Magn. Reson. Med.*, Vol. 6 (1988), page 164; B. R. Rosen et al, *Magn. Reson. Q.*, Vol. 5 (1989), page 26; J. W. Belliveau et al, *Science*, Vol. 254 (1990), page 716) for each voxel in order to generate images of relative cerebral blood volume (FIG. 3C). FIG. 3 also shows gradient-recalled echo images obtained with the new gradient sequence of the present invention at time t= 0 (A) and at the highest concentration of contrast agent (B). A conventional 128×128 spin-echo (TE 60 ms, TR 1000 ms) image (D) is given for comparison. Large differences in rCBV between grey and white matter are evident from image C, as has been demonstrated previously (A. Villringer et al, *Magn. Reson. Med.*, Vol. 6 (1988), page 164; B. R. Rosen et al, *Magn. Reson. Q.*, Vol. 5 (1989), page 26). Note also the strong influence of B1 inhomogeneity in A, B and D, but absent in the "calculated" image C.

EXAMPLE 4

In this example, the pulse sequence shown in FIG. 4A was tested. Slice selection was performed using a three lobed sinc RF pulse with a duration of 500 μs and a flip angle of about 10 degrees. The slice thickness was 5 mm and the field of view was 64 mm giving a nominal in-plane resolution of 1 mm for the 64×64 axial images. The field strength for the slice-selection gradient during the RF pulse was 56 mT/m and the ramp time for the gradient pulse was 275 μs. The dephasing of the slice-selection gradient combination lead to a signal attenuation of more than 95% for the unwanted primary echoes as calculated hereinabove. Each of the read-out gradient periods was 800 μs is corresponding exactly to the echo sampling interval. The ramp time was 550 μs to switch the polarities of the read-out gradient. The effective echo time (TE), the time interval between spin excitation and the center of the gradient echo-train formed in the subsequent TR-period, was 13.5 ms. The length of the train of four echoes in each TR-period was 4.8 ms measured from the start of the first echo until the end of the fourth echo. The repetition time (TR), the interval between RF pulses, was 9.0 ms leading to a total imaging time of 153 ms for a 64×64 matrix. Compared with the method employed in Example 1, hereinabove, approximately a four-fold increase in acquisition speed is observed.

Several fine adjustments in gradient amplitudes (tweakers) were implemented in the pulse sequence of FIG. 4A in order to optimize the echo shifting and acquisition. The phase-encoding "blips" were adjusted to a phase increment corresponding to exactly one-quarter of $k_y$-space. The dead time between the onset of the read gradient and echo sampling was adjusted to minimize timing error between the echo sampling periods and read-out gradient periods. The slice-selection gradient rephasing lobe was also tweaked to rephase all spins in the slice and therefore, optimize the signal-to-noise ratio (SNR) for the slice.

This experiment was tested on a spherical phantom containing pure water. The echo-shifting principles were first tested by switching off all phase-encoding gradients and comparing the primary (i.e., unwanted) echo amplitude to that of the shifted echoes. The primary echoes were attenuateed more than 95% as compared to the shifted echoes.

Figure 6A:
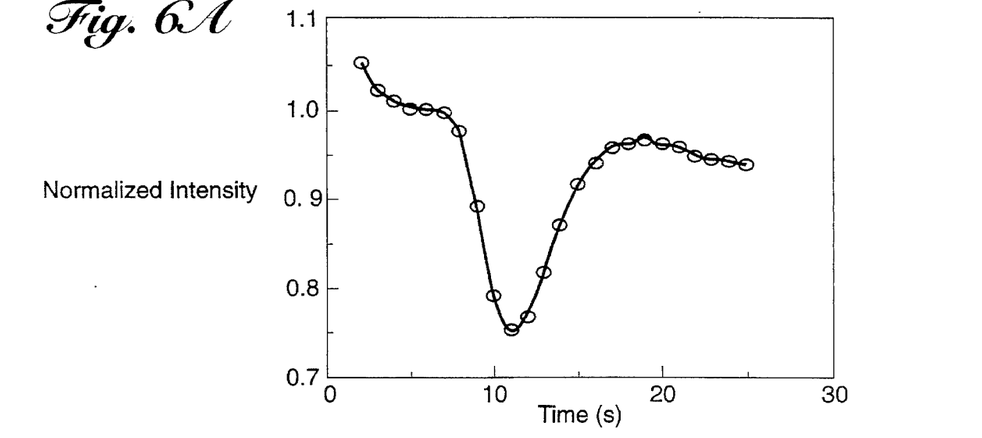
FIG. 6A is a plot of a normalized intensity as a function of time for a gradient-recalled echo sequence (symbol o) according to another embodiment of the present invention.
Figure 6B:
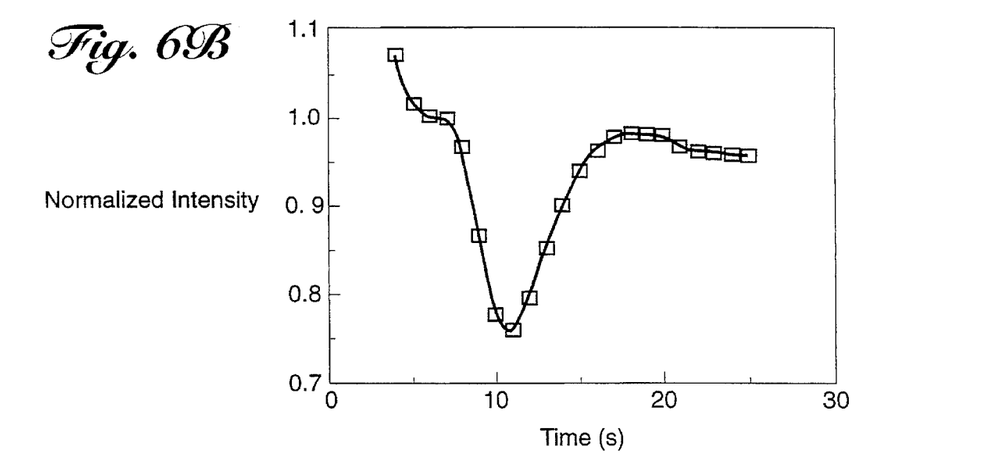
FIG. 6B is a plot of a normalized intensity as a function of time for a conventional gradient-recalled echo sequence (symbol □).
Figure 6C:
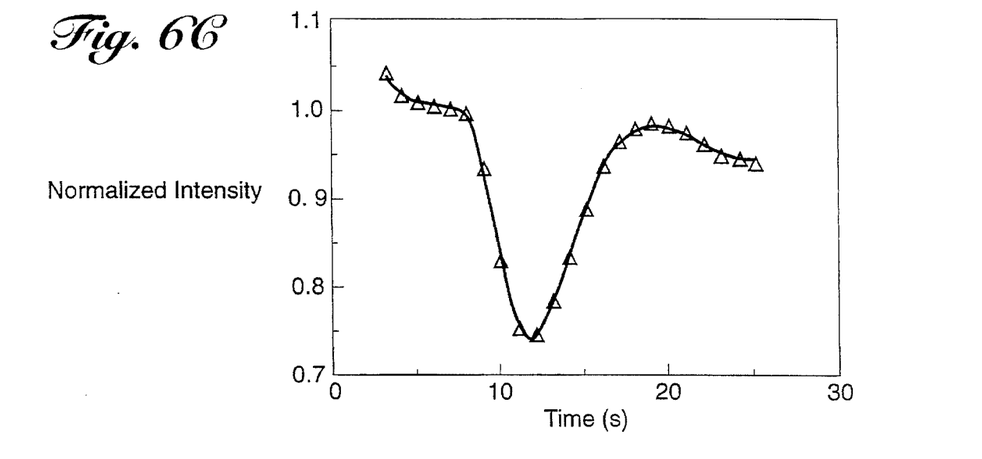
FIG. 6C is a plot of a normalized intensity as a function of time for a shifted gradient-recalled echo sequence (symbol ∆) according to the present invention.

This shifted echo-train pulse sequence was then used to asses relative cerebral blood volume (rCBV) in the cat brain by the method of dynamic contrast-enhanced susceptibility imaging. FIG. 6A, FIG. 6B, and FIG. 6C show the time course of the signal intensity changes in the cat brain following the injection of a bolus of Gd(DTPA) using the pulse sequence of FIG. 4A and, for comparison, a conventional gradient recalled echo method, and the pulse sequence of FIG. 1b, respectively. The intensity-time curves show the same decrease upon the first pass of the bolus and confirms that the shifted echo-train pulse sequence has the same sensitivity to dynamic susceptibility changes as the other two methods.

Figure 7A:
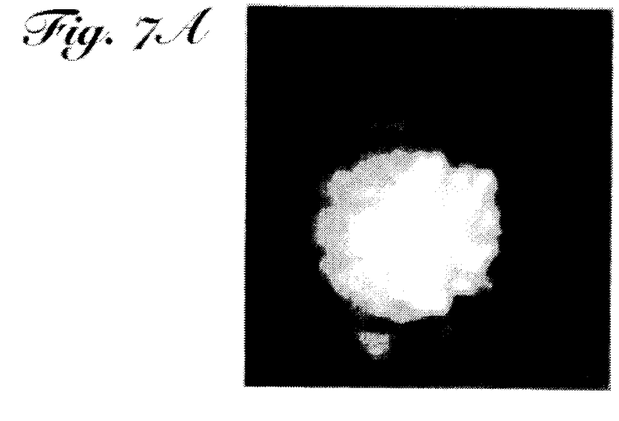
FIG. 7A, FIG. 7D, and FIG. 7G display single-slice 64×64 images of cat brain immediately before bolus injection (i.e., pre-bolus) for the pulse sequence of FIG. 4A and, a conventional gradient recalled echo method, and the pulse sequence of FIG. 1b, respectively.
Figure 7B:
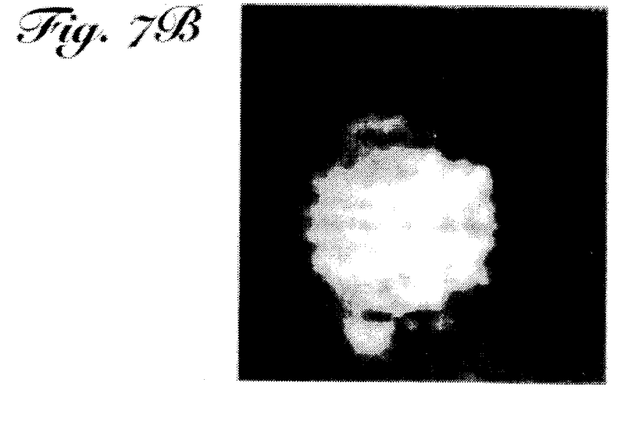
FIG. 7B, FIG. 7E, and FIG. 7H display single-slice 64×64 images of cat brain at the highest concentration of contrast agent (bolus maximum) for the pulse sequence of FIG. 4A, a conventional gradient recalled echo method, and the pulse sequence of FIG. 1b, respectively.
Figure 7C:
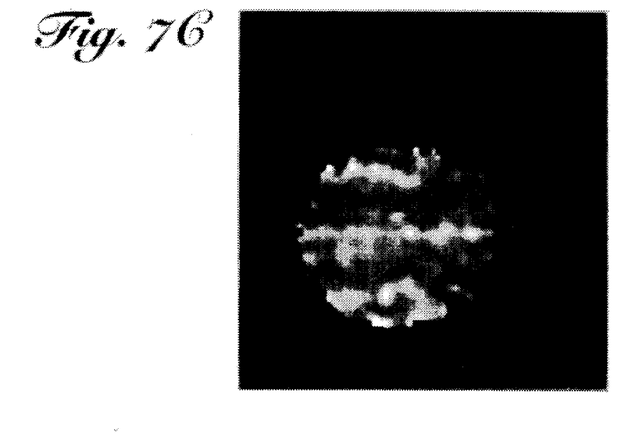
FIG. 7C, FIG. 7F, and FIG. 7I display the relative cerebral blood volume maps based on to the pulse sequence of FIG. 4A, a conventional gradient recalled echo method, and the pulse sequence of FIG. 1b, respectively.
Figure 7D:
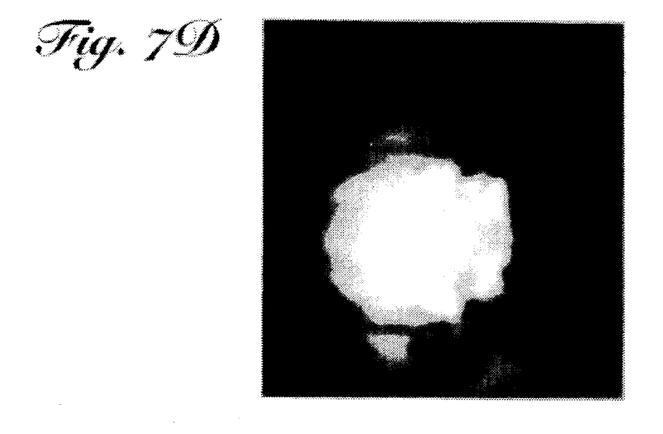
Figure 7E:
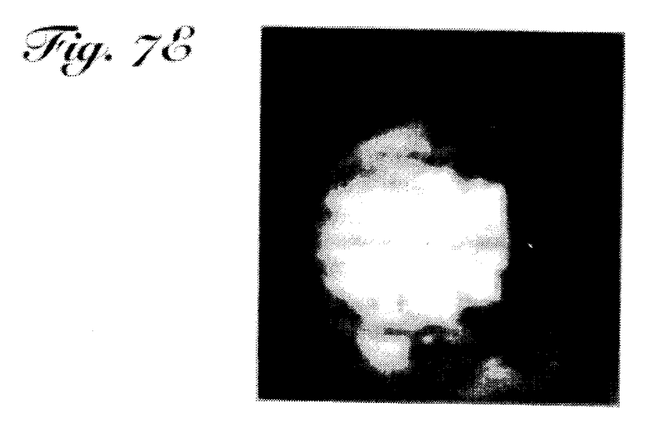
Figure 7F:
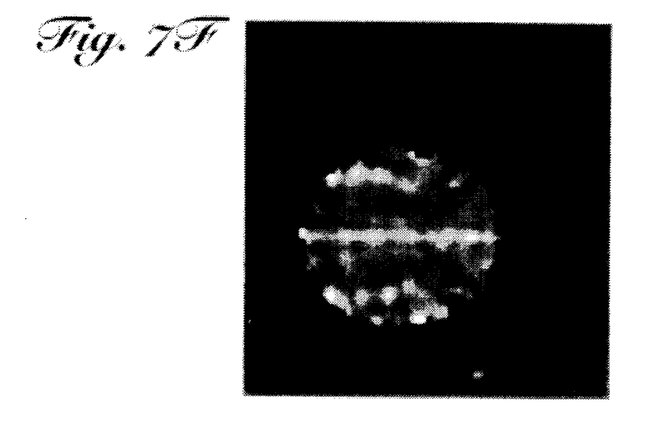
Figure 7G:
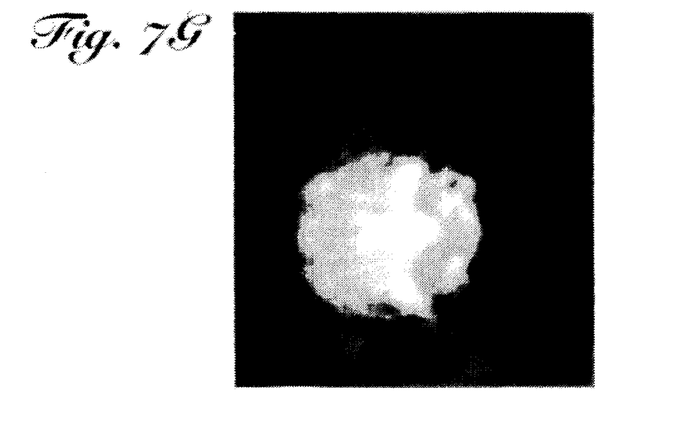
Figure 7H:
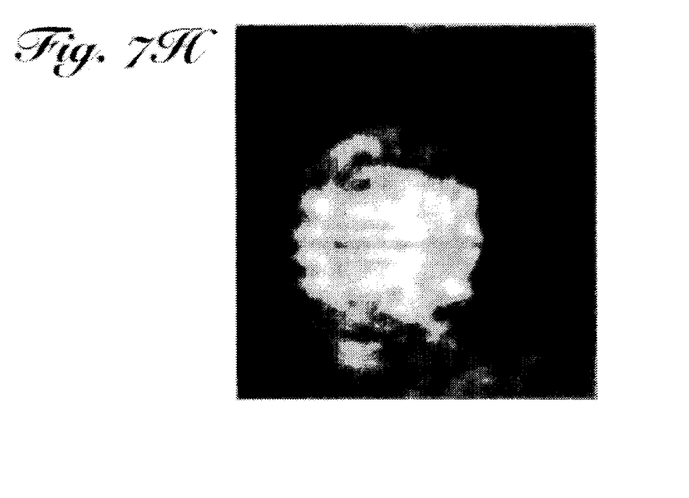

FIG. 7A, FIG. 7D, and FIG. 7G display single-slice 64×64 images of cat brain immediately before bolus injection (i.e., pre-bolus) for the pulse sequence of FIG. 4A and, a conventional gradient recalled echo method, and the pulse sequence of FIG. 1b, respectively. FIG. 7B, FIG. 7E, and FIG. 7H display single-slice 64×64 images of cat brain at the highest concentaration of contrast agent (bolus maximum) for the pulse sequence of FIG. 4A and, a conventional gradient recalled echo method, and the pulse sequence of FIG. 1b, respectively. As evinced by these figures, high quality images can be recorded using the shifted echo-train pulse sequence without apparent ghosting artifacts. The dynamic susceptibility effect caused by the contrast agent is demonstrated similarly by the invented method, yet at a much faster imaging speed.

Figure 7I:
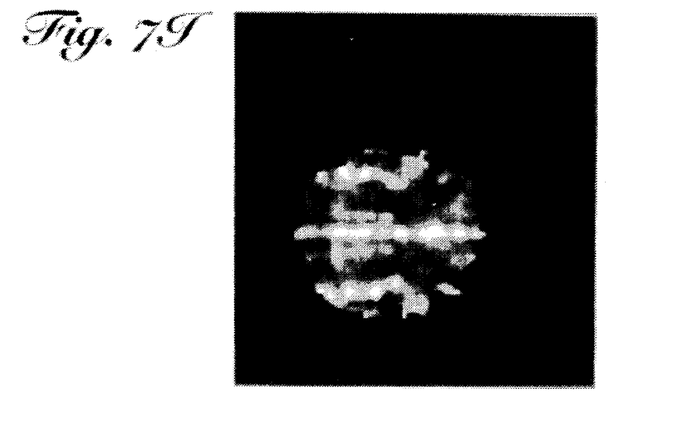

Changes in brain signal intensity due to transit of the bolus can be converted to contrast agent concentration-time curves or each voxel as explained hereinabove. The relative cerebral blood volume maps generated from these curves are comparable for all three methods as shown in FIG. 7C, FIG. 7F, and FIG. 7I which correspond, respectively, to the pulse sequence of FIG. 4A a conventional gradient recalled echo method, and the pulse sequence of FIG. 1b, respectively. The blood volume maps show an expected contrast between white and gray matter.

The general principles of dynamic susceptibility enhanced gradient-recalled echo imaging according to the present invention has been demonstrated in theory, and in experiments on cerebral blood volume measurements in cat using bolus tracking principles based on T2* changes. The new methods of the present invention are easy to use and are, compared to echo-planar methods, less demanding with respect to gradient hardware and field homogeneity.

Although the present invention has been described with reference to particular means, materials and embodiments, from the foregoing description, one skilled in the art can easily ascertain the essential characteristics of the present invention and various changes and modifications may be made to adapt the various uses and conditions without departing from the spirit and scope of the present invention as described in the claims which follow.

I claim:

1. A method for performing nuclear magnetic resonance of an object, comprising the steps of:
    providing a plurality of radio frequency pulses, each of said radio frequency pulses separated from the subsequent one of said radio frequency pulses by a respective repetition time period, each of said radio frequency pulses exciting at least some of the atoms of said object;
    inducing, within said respective repetition time period for each of at least one of said radio frequency pulses, an echo train having a plurality of gradient-recalled echoes, each gradient recalled echo characterized by a respective echo time period; and shifting at least one of said gradient-recalled echoes after the repetition period in which respective said echo train was induced, whereby said echo time period is greater than said repetition period.

2. The method according to claim 1, wherein said at least one gradient recalled echoes are shifted one repetition time period.

3. The method according to claim 1, wherein said gradient-recalled echo is shifted by applying an additional gradient at the beginning of said repetition time period of said radio frequency pulse, said additional gradient thereby dephasing any gradient-recalled echo spins that are excited and remain in said repetition time period.

4. The method according to claim 3, the step of providing a plurality of radio frequency pulses further comprising applying a slice selecting magnetic gradient field to the object while applying said radio frequency pulses, and wherein said additional gradient is applied in a direction having a parallel component with respect to said slice selecting magnetic gradient field.

5. The method according to claim 3, the step of providing a plurality of radio frequency pulses further comprising applying a slice selecting magnetic gradient field to the object while applying said radio frequency pulses, and wherein said additional gradient is applied in a direction having an orthogonal component with respect to said slice selecting magnetic gradient field.

6. The method according to claim 1, the step of providing a plurality of radio frequency pulses further comprising applying gradient pulse sequences in said repetition time periods, said successive gradient pulse sequences for respective successive repetition time periods having alternately reversed polarities.

7. The method according to claim 1, the step of providing a plurality of radio frequency pulses further comprising applying a slice selecting magnetic gradient field to the object while applying said radio frequency pulses, then applying a magnetic gradient field having a direction opposite to said slice selecting magnetic field, and having an integrated intensity equal to the integrated intensity of said slice selecting magnetic gradient, thereby maintaining zero net dephasing of spins excited by the excitation pulses associated with preceding repetition time periods.

8. The method according to claim 7, the step of providing a plurality of radio frequency pulses further comprising applying a rephasing magnetic gradient field at end of said repetition time period.

9. The method according to claim 8, wherein said rephasing magnetic gradient field is applied in the direction of said slice selecting magnetic gradient, said rephasing magnetic gradient field having an integrated intensity equal to about one half of the integrated intensity of said slice selecting magnetic gradient divided by an integer, said integer representing the number of repetition time periods that said gradient-recalled echoes are shifted, thereby rephasing spins excited by excitation pulses which precede said excitation pulse by said integer number of repetition time periods.

10. The method according to claim 8, wherein said rephasing magnetic gradient field is applied in a direction orthogonal to said slice selecting magnetic gradient.

11. The method according to claim 1, further comprising the steps of acquiring said gradient-recalled echoes, and generating an image according to said gradient-recalled echoes.

12. A method for performing nuclear magnetic resonance of an object, comprising the steps of:

providing a plurality of radio frequency pulses, each of said radio frequency pulses separated from the subsequent one of said radio frequency pulses by a respective repetition time period, each of said radio frequency pulses exciting at least some of the atoms of said object:

inducing, within said respective repetition time period for each of at least one of said radio frequency pulses, an echo train having a plurality of gradient-recalled echoes, each gradient recalled echo characterized by a respective echo time period; and shifting said echo train after the repetition period in which said echo train was induced, whereby said echo time period is greater than said repetition period.

13. The method according to claim 12, wherein said at least one gradient recalled echoes are shifted one repetition time period.

14. The method according to claim 12, wherein said gradient-recalled echo is shifted by applying an additional gradient at the beginning of said repetition time period of said radio frequency pulse, said additional gradient thereby dephasing any gradient-recalled echo spins that are excited and remain in said repetition time period.

15. The method according to claim 14, the step of providing a plurality of radio frequency pulses further comprising applying a slice selecting magnetic gradient field to the object while applying said radio frequency pulses, and wherein said additional gradient is applied in a direction having a parallel component with respect to said slice selecting magnetic gradient field.

16. The method according to claim 14, the step of providing a plurality of radio frequency pulses further comprising applying a slice selecting magnetic gradient field to the object while applying said radio frequency pulses, and wherein said additional gradient is applied in a direction having an orthogonal component with respect to said slice selecting magnetic gradient field.

17. The method according to claim 12, the step of providing a plurality of radio frequency pulses further comprising applying gradient pulse sequences in said repetition time periods, said successive gradient pulse sequences for respective successive repetition time periods having alternately reversed polarities.

18. The method according to claim 12, the step of providing a plurality of radio frequency pulses further comprising applying a slice selecting magnetic gradient field to the object while applying said radio frequency pulses, then applying a magnetic gradient field having a direction opposite to said slice selecting magnetic field, and having an integrated intensity equal to the integrated intensity of said slice selecting magnetic gradient, thereby maintaining zero net dephasing of spins excited by the excitation pulses associated with preceding repetition time periods.

19. The method according to claim 18, the step of providing a plurality of radio frequency pulses further comprising applying a rephasing magnetic gradient field at end of said repetition time period.

20. The method according to claim 19, wherein said rephasing magnetic gradient field is applied in the direction of said slice selecting magnetic gradient, said rephasing magnetic gradient field having an integrated intensity equal to about one half of the integrated intensity of said slice selecting magnetic gradient divided by an integer, said integer representing the number of repetition time periods that said gradient-recalled echoes are shifted, thereby rephasing spins excited by excitation pulses which precede said excitation pulse by said integer number of repetition time periods.

21. The method according to claim 19, wherein said rephasing magnetic gradient field is applied in a direction orthogonal to said slice selecting magnetic gradient.

22. The method according to claim 12, further comprising the steps of acquiring said gradient-recalled echoes, and generating an image according to said gradient-recalled echoes.

23. A method for acquiring NMR information, comprising the steps of:

providing a plurality of radio frequency pulses, each of said radio frequency pulses separated from the subsequent one of said radio frequency pulses by a respective repetition time period, each of said radio frequency pulses exciting at least some of the atoms of said object;

inducing, within said respective repetition time period for each of at least one of said radio frequency pulses, an echo train having a plurality of gradient-recalled echoes, each gradient recalled echo characterized by a respective echo time period;

shifting at least one of said gradient-recalled echoes for each said echo train after the repetition period in which respective said echo train was induced, whereby said echo time period is greater than said repetition period for said at least one of said gradient-recalled echoes; and acquiring said at least one of said gradient-recalled echoes.

* * * * *